(12) United States Patent
Rizzolo et al.

(10) Patent No.: US 11,069,854 B2
(45) Date of Patent: Jul. 20, 2021

(54) LASER ANNEAL FOR MRAM ENCAPSULATION ENHANCEMENT

(71) Applicant: International Business Machines Corporation, Armonk, NY (US)

(72) Inventors: Michael Rizzolo, Delmar, NY (US); Oscar van der Straten, Guilderland Center, NY (US); Alexander Reznicek, Troy, NY (US); Oleg Gluschenkov, Tannersville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/526,255

(22) Filed: Jul. 30, 2019

(65) Prior Publication Data

US 2020/0119263 A1    Apr. 16, 2020

Related U.S. Application Data

(60) Provisional application No. 62/745,716, filed on Oct. 15, 2018.

(51) Int. Cl.
| | |
|---|---|
| *H01L 43/00* | (2006.01) |
| *H01L 43/12* | (2006.01) |
| *H01L 27/22* | (2006.01) |
| *H01L 43/02* | (2006.01) |

(52) U.S. Cl.
CPC ............ *H01L 43/12* (2013.01); *H01L 27/222* (2013.01); *H01L 43/02* (2013.01)

(58) Field of Classification Search
None
See application file for complete search history.

(56) References Cited

U.S. PATENT DOCUMENTS

| | | | |
|---|---|---|---|
| 4,476,150 A | 10/1984 | Rose | |
| 6,121,130 A | 9/2000 | Chua et al. | |
| 2004/0266179 A1* | 12/2004 | Sharma | H01L 27/222 438/673 |
| 2009/0289284 A1 | 11/2009 | Goh et al. | |
| 2019/0393265 A1* | 12/2019 | Ying | H01L 43/10 |

* cited by examiner

*Primary Examiner* — Suberr L Chi
(74) *Attorney, Agent, or Firm* — Scully, Scott, Murphy & Presser, P.C.; Erik Johnson (57) ABSTRACT

A low temperature deposited (400° C. or less) dielectric passivation layer is formed on physically exposed surfaces of a material stack including a multilayered magnetic tunnel junction (MTJ) pillar and a top electrode. A laser anneal is then performed to improve the physical and chemical properties of the low temperature deposited dielectric passivation layer, without negatively impacting the multilayered MTJ pillar.

10 Claims, 5 Drawing Sheets

FIG. 7

LASER ANNEAL FOR MRAM ENCAPSULATION ENHANCEMENT

BACKGROUND

The present application relates to embedded high performance magnetoresistive random access memory (MRAM) devices, and more particularly to a MRAM device containing a multilayered magnetic tunnel junction (MTJ) pillar that contains a dielectric passivation layer that has improved mechanical and chemical properties as well as a method of making such a MRAM device.

MRAM is a non-volatile random access memory technology in which data is stored by magnetic storage elements. These elements are typically formed from two ferromagnetic plates, each of which can hold a magnetization, separated by a thin dielectric layer (i.e., a tunnel barrier). One of the two plates is a permanent magnetic set to a particular polarity (i.e., a magnetic reference layer); the other plate's magnetization can be changed to match that of an external field to store memory (i.e., a magnetic free layer). Such a configuration is known as a magnetic tunnel junction (MTJ) pillar. In leading-edge or neuromorphic computing systems, a MTJ pillar is typically embedded within a back-end-of-the-line (BEOL) structure.

In the manufacturing of a MRAM device, blanket layers of MTJ pillar materials (i.e., a magnetic reference material, a tunnel barrier, a magnetic free material and a MTJ cap material) and a top electrode material are formed upon a conductive landing pad; the conductive landing pad forms a bottom electrode of the MRAM device. The blanket layers are then patterned by lithography and etching to provide a material stack of a multilayered MTJ pillar (including remaining portions of the magnetic reference material, the tunnel barrier, the magnetic free material, and the MTJ cap material) and a top electrode located on the conductive landing pad. Immediately after the formation of this material stack, a dielectric passivation layer such as, for example, silicon nitride (SiN), is formed to passivate the tunnel barrier. The dielectric passivation layer is formed at a low deposition temperature (400° C. or less) to prevent surface diffusion of metal particles across the tunnel barrier which may lead to device shorting. The metal particles are formed during the etching of the blanket layers that provide the MTJ pillar. Low temperature deposited dielectric passivation layers are of poor quality, in terms of mechanical and chemical properties. Also, high temperature processing (above 500° C.) of the MTJ pillar containing the dielectric passivation layer is typically avoided since such processing leads to degradation of the properties of the MTJ pillar.

There is thus a need to provide a method of forming a low temperature deposited dielectric passivation layer that has improved mechanical and chemical properties, which does not adversary impact the properties of the MTJ pillar.

SUMMARY

A low temperature deposited (400° C. or less) dielectric passivation layer is formed on physically exposed surfaces of a material stack including a multilayered magnetic tunnel junction (MTJ) pillar and a top electrode. A laser anneal is then performed to improve the physical and chemical properties of the low temperature deposited dielectric passivation layer, without negatively impacting the multilayered MTJ pillar.

In one aspect of the present application, a method of forming a magnetoresistive random access memory (MRAM) device is provided. In one embodiment, the method includes forming a structure including a multilayered MTJ pillar located on a surface of a conductive landing pad, and a top electrode located on the multilayered MTJ pillar. A dielectric passivation layer is then formed on physically exposed surfaces of the structure utilizing a deposition process that is performed at a temperature of 400° C. or less. A laser anneal is then performed on the structure including the dielectric passivation layer to provide a laser annealed dielectric passivation layer, without negatively impacting the multilayered MTJ pillar. In some embodiments, and prior to the laser anneal, an etch is performed to remove the dielectric passivation layer from horizontal surfaces of the structure, while maintaining the dielectric passivation layer on the sidewalls of top electrode and the multilayered MTJ pillar.

In another aspect of the present application, a magnetoresistive random access memory (MRAM) device is provided. In one embodiment, the MRAM device includes a multilayered MTJ pillar located on a surface of a conductive landing pad. A top electrode is located on the multilayered MTJ pillar. A laser annealed dielectric passivation layer is present on at least outermost sidewalls of the top electrode and the multilayered MTJ pillar.

The laser annealed dielectric passivation layer has improved mechanical and chemical properties as compared to a low temperature deposited dielectric passivation layer that is not subject to laser annealing. In some embodiments, the laser annealed dielectric passivation layer has a higher Young's modulus, a higher etch resistance and/or a lower impurity content as compared to a low temperature deposited dielectric passivation layer that is not subject to laser annealing. In some embodiments, the laser annealed dielectric passivation layer can have improved bonding and/or hermeticity as compared to a low temperature deposited dielectric passivation layer that is not subject to laser annealing.

In some embodiments, the entirety of the laser annealed dielectric passivation layer has the improved mechanical and chemical properties. In other embodiments, only a surface portion of the annealed dielectric passivation layer has the improved mechanical and chemical properties; the remaining portion of the laser annealed dielectric passivation layer that is beneath the surface portion has mechanical and chemical properties of the as-deposited dielectric passivation layer.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Magnetoresistive random access memory (MRAM) is a non-volatile memory that combines a magnetic device with standard silicon-based microelectronics to obtain the combined attributes of non-volatility, high-speed read/write operations, high read/write endurance and data retention. Data is stored in MRAM as magnetic states or characteristics (e.g., polarity or magnetic moment) instead of electric charges. In a typical configuration, each MRAM cell includes a magnetic tunnel junction (MTJ) pillar (i.e., pillar) for data storage, a bit line and a word line. In general, the MTJ's electrical resistance will be high or low based on the relative magnetic states of certain layers within the MTJ pillar. Data is written to the MTJ pillar by applying certain magnetic fields or charge currents to switch the magnetic states of the layers of the MTJ pillar. Data is read by detecting the resistance of the MTJ pillar. Using a magnetic state/characteristic for storage has two main benefits. First, unlike electric charge, magnetic state does not leak away with time, so the stored data remains even when system power is turned off. Second, switching magnetic states has no known wear-out mechanism. The term "magnetoresistance" describes the effect whereby a change to certain magnetic states of the MTJ pillar results in a change to the MTJ resistance, hence the name "Magnetoresistive" RAM.

Figure 1:
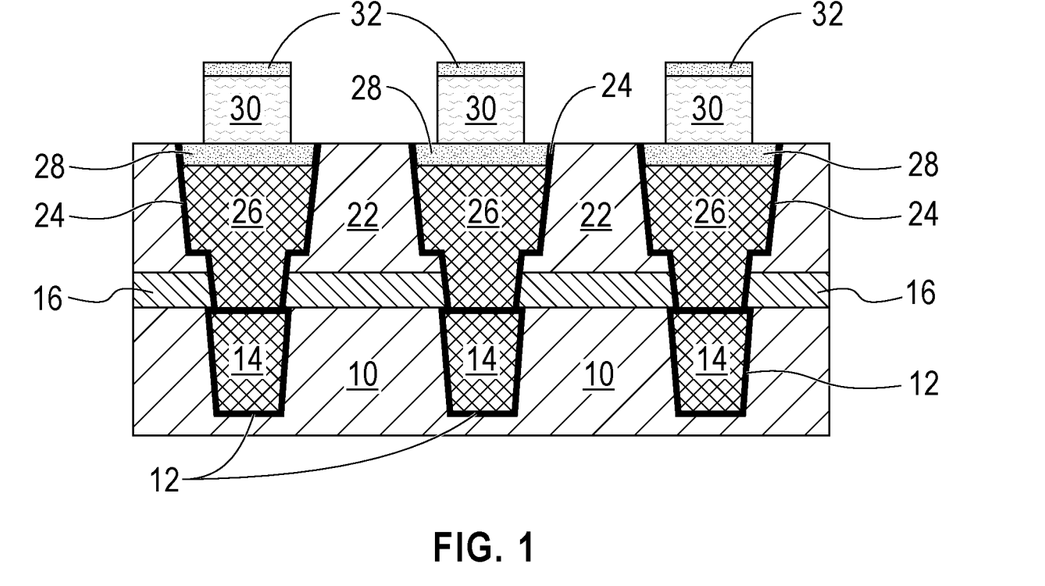
FIG. 1 is a cross sectional view of an exemplary structure of the present application and during an early stage of fabrication, and including a multilayered MTJ pillar located on a surface of a conductive landing pad, and a top electrode located on the multilayered MTJ pillar.

Referring first to FIG. 1, there is illustrated an exemplary structure of the present application and during an early stage of fabrication. The exemplary structure of FIG. 1 includes a multilayered MTJ pillar 30 located on a surface of a conductive landing pad 28, and a top electrode 32 located on the multilayered MTJ pillar 30. It is noted that the drawings of the present application illustrate an MRAM device area in which an MRAM device will be formed. A non-MRAM device area can be located laterally adjacent to the MRAM device area illustrated in the drawings of the present application. It is also noted that although the drawings illustrate a plurality of multilayered MTJ pillars 30, the present application can be employed when a single multilayered MTJ pillar is formed.

As is shown, the conductive landing pad 28, which serves as a bottom electrode of the MRAM device, is located on a surface of an electrically conductive structure 26 that is embedded in an interconnect dielectric material layer 22 of an underlying interconnect level. In some embodiments (and as is illustrated), the conductive landing pad 28 is located on a recessed surface of the electrically conductive structure 26. In other embodiments (not shown), the conductive landing pad 28 is formed on a non-recessed surface of the electrically conductive structure 26. In such an embodiment, a dielectric capping layer can be located laterally adjacent to the conductive landing pad 28 and on a surface of the interconnect dielectric material layer 22.

In some embodiments, a lower interconnect level can be present beneath the interconnect level containing the electrically conductive structure 26. The lower interconnect level includes an electrically conductive structure 14 that is embedded in interconnect dielectric material layer 10. A dielectric capping layer 16 can separate the interconnect level containing the electrically conductive structure 26 from the lower interconnect level containing the electrically conductive structure 14. In some embodiments, a diffusion barrier liner (e.g., 12, 24) is formed along the sidewalls and bottom wall of each electrically conductive structure. In some embodiments, no diffusion barrier liners are present. The interconnect levels that are located beneath the multilayered MTJ pillar 30 can be formed utilizing techniques well known to those skilled in the art. So as not to obscure the method of the present application, the techniques used to form the various levels that are located beneath the multilayered MTJ pillar 30 are not provided herein.

Interconnect dielectric material layer 10 and interconnect dielectric material layer 22 can be composed of a same dielectric material or they can be composed of compositional different dielectric materials. Examples of dielectric materials that can be used for interconnect dielectric material layer 10 and interconnect dielectric material layer 22 include silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The various electrically conductive structures (14, 26) can be composed of a same or a different electrically conductive metal or metal alloy. Examples of electrically conductive materials that can be used in the present application include copper (Cu), aluminum (Al), or tungsten (W), while an example of an electrically conductive metal alloy is a Cu—Al alloy.

In some embodiments, the level including elements 10 and 14 is a middle-of-the-line (MOL) level rather than an interconnect level. In such an embodiment, element 10 would be a MOL dielectric material such as, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. Also, and in such an embodiment, element 14 is a contact structure that includes a contact metal or metal alloy such as, tungsten (W), cobalt (Co), platinum (Pt), nickel (Ni) or alloys thereof.

The diffusion barrier liners 12 and 24 can include a same or different diffusion barrier material (i.e., a material that serves as a barrier to prevent a conductive material such as copper from diffusing there through). Examples of diffusion barrier materials that can be used in providing the diffusion barrier liner 12 and 24 include, but are not limited to, Ta, TaN, Ti, TiN, Ru, RuN, RuTa, RuTaN, W, or WN. In some embodiments, the diffusion barrier material can include a material stack of diffusion barrier materials. In one example, the diffusion barrier material can be composed of a stack of Ta/TaN.

If present, dielectric capping layer 16 can be composed of SiC, $Si_3N_4$, $SiO_2$, a carbon doped oxide, a nitrogen and hydrogen doped silicon carbide SiC(N,H) or multilayers thereof. The thickness of the dielectric capping layer 16 can vary depending on the technique used to form the same as well as the material make-up of the layer. In one example, the dielectric capping layer 16 can have a thickness from 15 nm to 100 nm. Other thicknesses that are lesser than 15 nm, or greater 100 nm can also be employed as the thickness of the dielectric capping layer 16. In some embodiments, the dielectric capping layer 16 can be omitted from the exemplary structure.

Conductive landing pad 28, which is formed on a physically exposed surface of electrically conductive structure 26 can be composed of Ta, TaN, Ti, TiN, Ru, RuN, RuTa, RuTaN, Co, CoWP, CoN, W, WN or any combination thereof. The conductive landing pad 28 can have a thickness from 2 nm to 25 nm; other thicknesses are possible and can be used in the present application as the thickness of the conductive landing pad 28. The conductive landing pad 28 can be formed by a deposition process such as, for example, sputtering, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing), or a patterning process (such as, for example, lithography and etching) can follow the deposition of the conductive material that provides the conductive landing pad 28.

In some embodiments, the conductive landing pad 28 has a topmost surface that is coplanar with a topmost surface of a dielectric capping layer that can be present laterally adjacent to the conductive landing pad 28 and on a topmost surface of the interconnect dielectric material layer 22. In other embodiments (as is shown in FIG. 1), the conductive landing pad 28 has a topmost surface that is coplanar with a topmost surface of the interconnect dielectric material layer 22.

A multilayered MTJ pillar 30 is located on a surface of the conductive landing pad 28, and a top electrode 32 is present on the multilayered MTJ pillar 30. The multilayered MTJ pillar 30 and the top electrode 32 can be formed by first depositing various blanket layers of materials that provide the multilayered MTJ pillar 30 and the top electrode 32, and thereafter the blanket multilayered material stack is subjected to a patterning process such as, for example, lithography and etching. The depositing of the various blanket layers of materials that provide the multilayered MTJ pillar 30 and the top electrode 32 can include CVD, PECVD, ALD, PVD, sputtering, or plating.

The multilayered MTJ pillar 30 can include a stack, from bottom to top, of a magnetic reference layer (that may include one or more magnetic reference materials), a tunnel barrier, a magnetic free layer (that may include one or more magnetic reference materials), and a MTJ cap. In some embodiment, the MTJ pillar can include a stack, from bottom to top, of a magnetic free layer, a tunnel barrier layer and a magnetic reference layer.

The magnetic reference layer has a fixed magnetization. The magnetic reference layer can be composed of a metal or metal alloy that includes one or more metals exhibiting high spin polarization. In alternative embodiments, exemplary metals for the formation of the magnetic reference layer include iron, nickel, cobalt, chromium, boron, or manganese. Exemplary metal alloys can include the metals exemplified by the above. In another embodiment, the magnetic reference layer can be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that can be used include a metal such as cobalt, nickel, platinum, palladium, iridium, or ruthenium, and can be arranged as alternating layers. The strong PMA region can also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys can be arranged as alternating layers. In one embodiment, combinations of these materials and regions can also be employed.

The tunnel barrier is composed of an insulator material and is formed at such a thickness as to provide an appropriate tunneling resistance. Exemplary materials for the tunnel barrier include magnesium oxide, aluminum oxide, and titanium oxide, or materials of higher electrical tunnel conductance, such as semiconductors or low-bandgap insulators.

The magnetic free layer is composed of a magnetic material with a magnetization that can be changed in orientation relative to the magnetization orientation of the reference layer. Exemplary materials for the free layer of the multilayered MTJ pillar 30 include alloys and/or multilayers of cobalt, iron, alloys of cobalt-iron, nickel, alloys of nickel-iron, and alloys of cobalt-iron-boron.

The MTJ cap can be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap can have a thickness from 2 nm to 25 nm; other thicknesses are possible and can be used in the present application as the thickness of the MTJ cap.

The top electrode 32 can be composed of one of the conductive materials mentioned above for the conductive landing pad 28. The conductive material that provides the top electrode 32 is typically compositionally different from the MTJ cap. The top electrode 32 can have a thickness within the thickness range mentioned above for the conductive landing pad 28. The top electrode 32 can be formed utilizing one of the deposition processes mentioned above in providing the conductive landing pad 28.

In some embodiments and as shown in FIG. 1, the top electrode 32 has an outermost sidewall that is vertically aligned to an outermost sidewall of the multilayered MTJ pillar 30. In some embodiments and also shown in FIG. 1, the multilayered MTJ pillar 30 is located only a portion of the conductive landing pad 28. In other embodiments, the multilayered MTJ pillar 30 extends across an entirety of the conducting landing pad 28.

Figure 2:
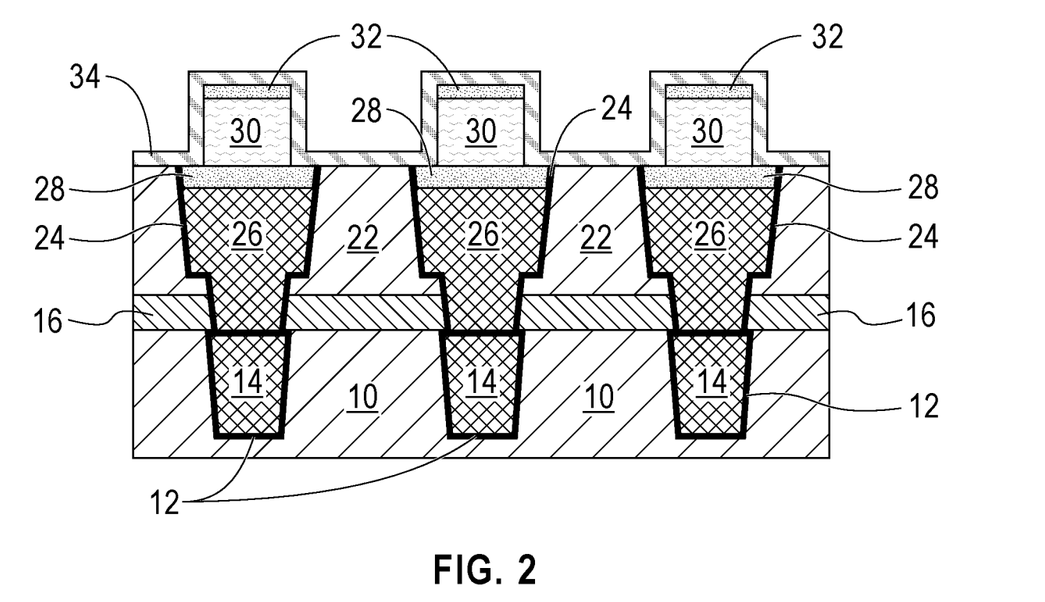
FIG. 2 is a cross sectional view of the exemplary structure of FIG. 1 after forming a dielectric passivation layer utilizing a low temperature deposition process.

Referring now to FIG. 2, there is illustrated the exemplary structure of FIG. 1 after forming a dielectric passivation layer 34 utilizing a low temperature deposition process. The term "low temperature deposition process" denotes a deposition process that is performed at a temperature of 400° C. or less. In one embodiment, the deposition of the dielectric passivation layer 34 is performed at a temperature from 200° C. to 400° C. In an alternative embodiment, the deposition of the dielectric passivation layer 34 is performed at a temperature from 200° C. to 350° C. Such a low temperature deposition is required to prevent surface diffusion of metal particles across the tunnel barrier layer of the multilayered MTJ pillar 30 which may lead to device shorting. The metal particles are formed during the etching of the blanket layers that provide the multilayered MTJ pillar 30.

The dielectric passivation layer 34 is a continuous, conformal layer that is formed upon the physically exposed surfaces of the exemplary structure of FIG. 1. Notably, the dielectric passivation layer 34 is formed on the physically exposed surfaces of each of the interconnect dielectric material layer 22, multilayered MTJ pillar 30, and the top electrode 32. If not entirely covered by the multilayered MTJ pillar 30, the dielectric passivation layer 34 can be formed on physically exposed surfaces of the conductive landing pad 28. The term "conformal" denotes that a material layer has a vertical thickness along horizontal surfaces that is substantially the same (i.e., within ±5%) as the lateral thickness along vertical surfaces.

In one embodiment, the dielectric passivation layer 34 can be composed of silicon nitride. In another embodiment, the dielectric passivation layer 34 can be composed of a dielectric material that contains atoms of silicon, carbon and hydrogen. In some embodiments, and in addition to atoms of carbon and hydrogen, the dielectric material that provides the dielectric passivation layer 34 can include atoms of at least one of nitrogen and oxygen. In other embodiments, and in addition to atoms of silicon, nitrogen, carbon and hydrogen, the dielectric material that provides the dielectric passivation layer 34 can include atoms of boron. In one example, the dielectric passivation layer 34 can be composed of an nBLOK dielectric material that contains atoms of silicon, carbon, hydrogen, nitrogen and oxygen. In alternative example, the dielectric passivation layer 34 can be composed of a SiBCN dielectric material that contains atoms of silicon, boron, carbon, hydrogen, and nitrogen.

The dielectric passivation layer 34 can be formed utilizing a deposition process such as, for example, CVD, PECVD, PVD, or ALD. The dielectric passivation layer 34 can have a thickness from 10 nm to 200 nm. Other thicknesses are possible and can be employed as the thickness of the dielectric passivation layer 34.

The dielectric passivation layer 34, which may also be referred to herein as a low temperature deposition dielectric passivation layer, or an as-deposited dielectric passivation layer, is of low quality. Stated in other terms, the dielectric passivation layer 34 has poor mechanical and chemical properties associated therewith that need to be improved prior to further processing of the MTJ device. By "low quality" it is meant that the dielectric passivation layer 30 is defective (contains a high content of carbon and hydrogen impurities), has poor hermeticity, a low Young's modulus, and a relatively high amount of bond terminating radicals such hydrogen, hydro-carbon groups, and amino groups that disrupt a framework of chemically strong —Si—O—, —Si—N—, —C—N— and —B—N— bonding chains. Consequently, the dielectric passivation layer 34 has a low etch resistance and a high etch or erosion rate.

Figure 3:
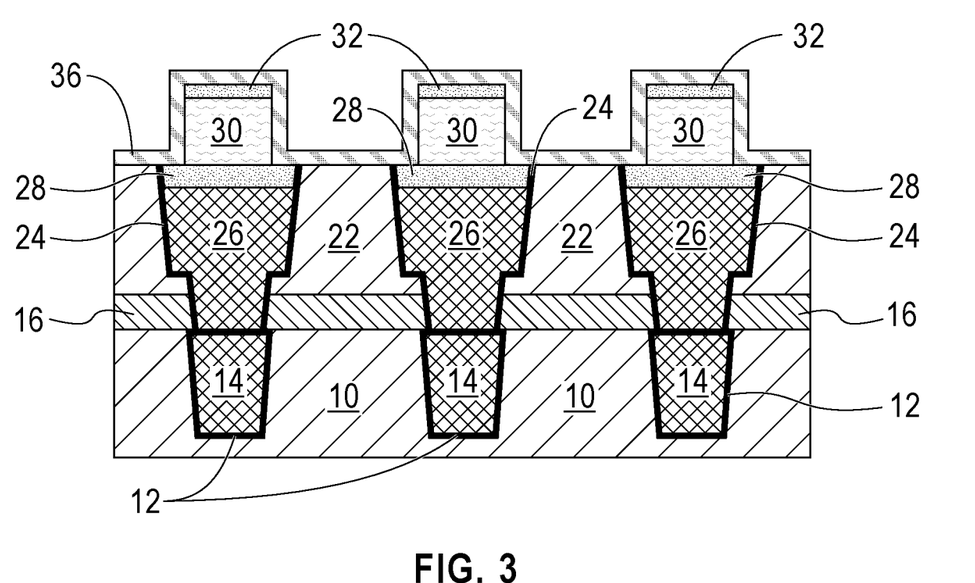
FIG. 3 is a cross sectional view of the exemplary structure of FIG. 2 after performing a laser anneal to improve the mechanical and chemical properties of the low temperature deposited dielectric passivation layer.

Referring now to FIG. 3, there is illustrated the exemplary structure of FIG. 2 after performing a laser anneal to improve the mechanical and chemical properties of the low temperature deposited dielectric passivation layer (i.e., dielectric passivation layer 34). In the drawing, element 36 is used to designate the laser annealed dielectric passivation layer. It is noted that the use of a laser anneal process to improve the properties of the dielectric passivation layer 34 is not obvious since high temperature processing (above 500° C.) of a multilayered MTJ pillar is typically not performed because such high temperature processing causes degradation of the multilayered MTJ pillar 30. The Applicant of the present application has determined unexpectedly and through experimentation that a short duration (within a nanosecond range) laser anneal, as defined herein, can be used to improve the properties of the dielectric passivation layer 34, without negatively impacting the multilayered MTJ pillar 30.

In some embodiments and when a thin (less than 25 nm) dielectric passivation layer 34 is formed, the entirety of the laser annealed dielectric passivation layer 36 has the improved mechanical and chemical properties. In other embodiments and when a thick dielectric passivation layer 34 is formed, only a surface portion of the annealed dielectric passivation layer 36 has the improved mechanical and chemical properties; the remaining portion of the laser annealed dielectric passivation layer 36 that is beneath the surface portion has mechanical and chemical properties of the dielectric passivation layer 34.

In some embodiments, the laser anneal is employed for hardening the dielectric passivation layer 34 present on the magnetic tunnel junction (MTJ) pillar 30 to make the laser annealed dielectric passivation layer 36 more etch resistant. As used herein, the term "laser annealing" denotes an annealing method that employs a laser to induce heat in the surface being treated. A laser is an electro-optical device that emits coherent radiation. In some embodiments, a typical laser emits light in a narrow, low-divergence beam and with a defined wavelength. In some instances, the advantages of employing laser for annealing processes is that its light can be easily shaped and focused onto a specific area of the annealing surface to achieve very high radiation intensity with short exposure durations.

In some embodiments, the short exposure duration is achieved by raster scanning focused laser beam over the substrate surface including the dielectric passivation layer 34, the top electrode 32, and the MTJ pillar 30. In this case, the exposure duration measured at incident intensity FWHM is the beam width in the scanning direction divided by the scanning velocity. In alternative embodiments, the short exposure duration is achieved by employing a pulsed laser. In this case, the laser beam is shaped to achieve a required peak intensity over a selected substrate area such as over an entire product die and the laser is operated in a pulsed mode such as in the case of Q-switched laser. The pulse duration of Q-switched laser at intensity FWHM (i.e., full with at half maximum) determines the substrate exposure time. The exposure process is repeated for entire wafer surface in a step-and-repeat approach. In some embodiments, the exposure to light, i.e., by laser annealing, e.g., application of the laser beam, includes 1 pulse to 100 pulses of light exposure.

In some embodiments, the laser type that is employed in the laser annealing method of the present application is selected from a solid-state Nd:YAG laser emitting at 1064 nm and frequency-doubled or -tripled emitting at 532 nm or 355 nm, respectively, or an excimer laser emitting at below 400 nm. Excimer lasers can be powered by a chemical reaction involving an excited dimer, or excimer, which is a short-lived dimeric or heterodimeric molecule formed from two species (atoms), at least one of which is in an excited electronic state. Commonly used excimer molecules include $F_2$ (fluorine, emitting at 157 nm), and noble gas compounds such as ArF (193 nm), KrCl (222 nm), KrF (248 nm), XeCl (308 nm), and XeF (351 nm). Excimer lasers are usually operated in a Q-switched, pulsed mode suitable for step-and-repeat pulsed wafer exposure. Solid-state Nd:YAG lasers provide an alternative to excimer lasers due to its stable, high-power output at 1,064 nm that can be efficiently frequency doubled or tripled emitting radiation at 532 nm or 355 nm. Solid state lasers can be configured in continuous, pulsed, or Q-switched pulsed modes suitable for both raster scanning and step-and-repeat pulsed operation. The laser wavelength selection is important for coupling laser radiation into suitable absorbing materials. Common dielectric materials are either not absorbing or only weakly absorbing (e.g., absorbing less than 5% of the coupled radiation) even at a short wavelength of from about 350 nm to about 250 nm; the term "about" is used herein to denote ±10 percent or less from a stated value. Metals and metallic compounds, on the other hand, absorb radiation at a wavelength of about 600 nm or shorter making shorter wavelength laser more preferred for structures with metallic layers. In some embodiments, an XeCl laser (308 nm) can be employed coupling about 35% of its incident radiation into the top electrode 32 and the multilayered MTJ pillar 30, primary into the top electrode 32, within about 10 nm to about 20 nm of the surface. In alternative embodiments, an XeCl laser (308 nm) can be employed coupling about 60% of its incident radiation into a copper layer placed atop of the top electrode 32 within about 20 to about 30 nm of the surface.

Once the substrate including the dielectric passivation layer 34, the top electrode 32, and the MTJ pillar 30 is exposed to the laser radiation either through raster scanning or through a laser pulse, the temperature of MTJ pillar 30 and top electrode 32 begins raising from its base value and falls shortly after. Raising temperature of MTJ pillar 30 and top electrode 32 causes thermal energy or heat to flow into adjacent structures including the dielectric passivation layer 34 raising their temperature in lock step with that of MTJ pillar 30 and top electrode 32. A representative temperature-time trace of a nanosecond laser anneal process includes four (4) distinct temperature regions: initial or base substrate temperature, heat-up portion, temperature peak point, and cool down portion. Initial or base substrate temperature is within the range of from 23° C. (room temperature) to 400° C. This temperature is typically set by a hot plate on which the substrate resides. Alternative heating devices may also be used to keep the substrate at a base temperature. Such alternative or additional heating devices can include backside or frontside lamp annealing, microwave heating, and secondary millisecond-scale pre-heat lasers beams. The laser beam having wavelength at near 308 nm raises the surface temperature of substrate including the dielectric passivation layer 34, the top electrode 32, and the MTJ pillar 30 from the base temperature to the peak with the ramp up rate from about 1,000,000,000° C./sec to about 100,000,000,000° C./sec. After laser radiation exposure, the surface temperature including that of the dielectric passivation layer 34, the top electrode 32, and the MTJ pillar 30 quickly drops back to the base temperature with the temperature ramp down rate of from about 300,000,000° C./sec to about 30,000,000,000° C./sec. The anneal duration measured at around the temperature peak point, typically at a level 50° C. below the peak point, ranges from about 1 nanosecond to about 500 nanoseconds but from about 10 to about 100 nanoseconds is more typical. It is customary to specify the process duration of laser anneals in terms of the radiation exposure duration at FWHM rather than the anneal duration at the temperature level 50° C. below the peak temperature. These duration quantities are related to each other and, in some embodiments, the anneal duration is a fraction (e.g., about ⅓) of the radiation exposure duration.

Laser-induced surface temperature rise is set by the laser incident radiation intensity, laser pulse or exposure duration, and optical and thermal properties of the dielectric passivation layer 34, the top electrode 32, the multilayered MTJ pillar 30, and underlying substrate. Short frontside laser exposure causes a non-uniform heating of the dielectric passivation layer 34, the top electrode 32, the multilayered MTJ pillar 30, and underlying substrate. The heat penetration depth in the case of nanosecond-scale laser pulses ranges from about 1 micron to about 5 microns in metallic structures such as copper and from about 100 nanometers to about 500 nanometers in typical interconnect dielectrics. Accordingly, a relatively thick multilayered MTJ pillar 30 and various electrically conductive structures (32, 28, 26) of about 150 nm in thickness residing on an interconnect dielectric is heated relatively uniformly throughout its entire thickness with a small top-to-bottom temperature gradient of approximately 0.1-0.3° C./nm. This also ensures that the adjacent dielectric passivation layer 34 is also heated to a similar temperature throughout its thickness of less than about 25 nm. The temperature gradient in the dielectric structures is several times larger and typically 0.3-3° C./nm but on the scale of 25 nm or less, the temperature drop is still relatively small.

It will be appreciated that the required radiation intensity at which the multilayered MTJ pillar 30 and the dielectric passivation layer 34 reach a target anneal temperature range of from about 1000° C. to about 1300° C. depends on specific multilayered MTJ pillar 30, various electrically conductive structures (32, 28, 26), dielectric passivation layer 34, underlying substrate, laser pulse duration, and selected laser wavelength. However, the required incident radiation intensity can be determined experimentally for specific set of the multilayered MTJ pillar 30, various electrically conductive structures (32, 28, 26), dielectric passivation layer 34 and annealing parameters by incorporating copper material into the top electrode 32 and observing its melting point at about 1090° C. In some embodiments, the nanosecond laser wavelength is 308 nm, the substrate base temperature is 250° C., the pulse duration at FWHM is 160 nanoseconds, and the coupled laser energy density at which the copper layer of top electrode 32 starts to melt is 0.13 J/cm$^2$ (this corresponds to 0.2 J/cm$^2$ of incident laser energy density). This calibration point can be converted into the required incident laser energy density for a particular choice of top electrode by properly normalizing to the top electrode optical reflectance at 308 nm. For instance, the required incident laser energy density to anneal the multilayered MTJ pillar 30 with a ruthenium-based the top electrode 32 (with about 0.65 of optical reflectance at 308 nm) to about 1090° C. will be around 0.37 J/cm$^2$. Accordingly, in this example, the targeted annealing temperature range of from about 1000° C. to about 1300° C. will require the incident laser energy density to be from 0.33 J/cm$^2$ to 0.46 J/cm$^2$. While the multilayered MTJ pillar 30, various electrically conductive structures (32, 28, 26), dielectric passivation layer 34, the substrate structure and the laser parameters can vary affecting the choice of the incident laser energy density, the range of incident laser energy density from about 0.1 J/cm$^2$ to about 3 J/cm$^2$ and laser radiation exposure duration from about 5 to about 200 nanoseconds can be employed to raise the multilayered MTJ pillar 30 temperature including the temperature of adjacent dielectric passivation layer 34 to the range of from about 1000° C. to about 1300° C.

Figure 6:
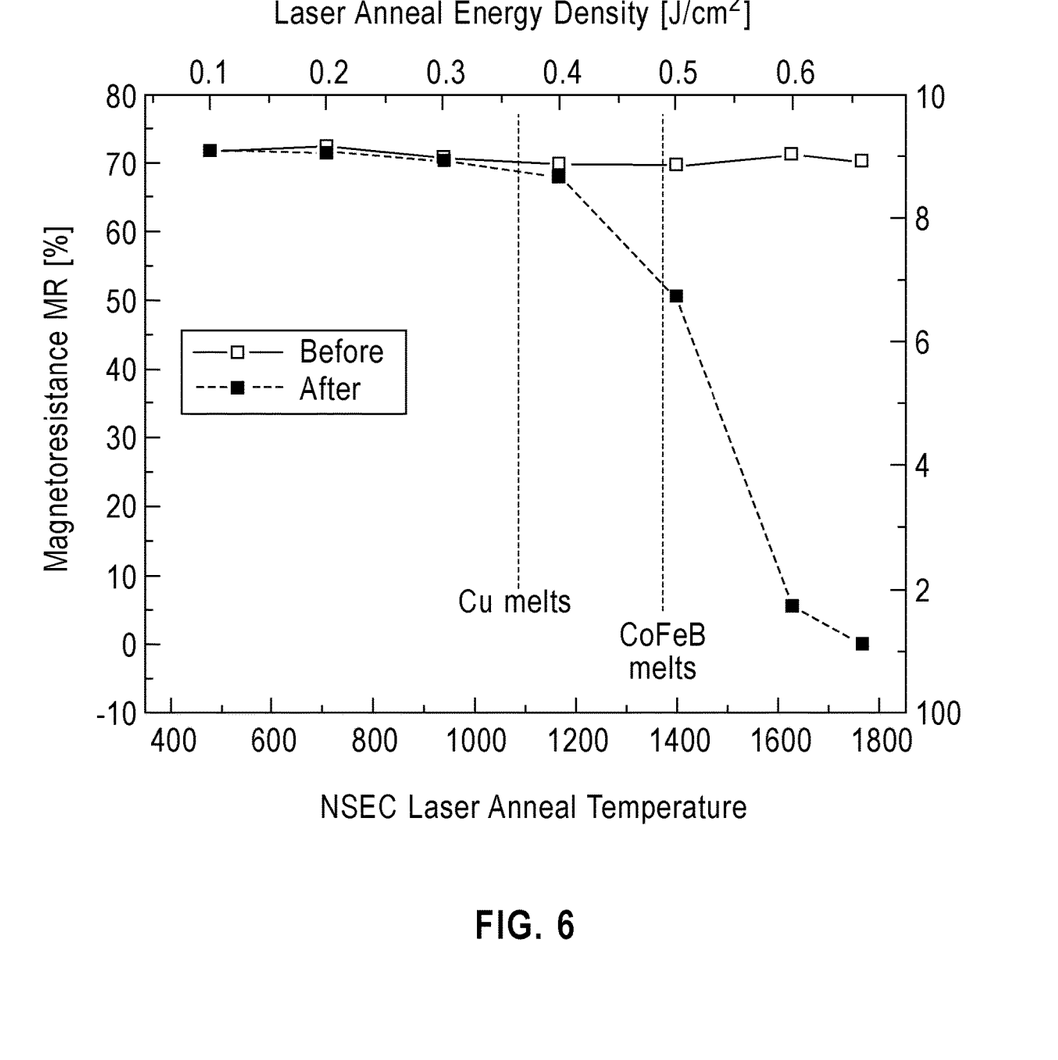
FIG. 6 is a graph that illustrates that the laser anneal of the present application does not negatively impacting the multilayered MTJ pillar.
Figure 7:
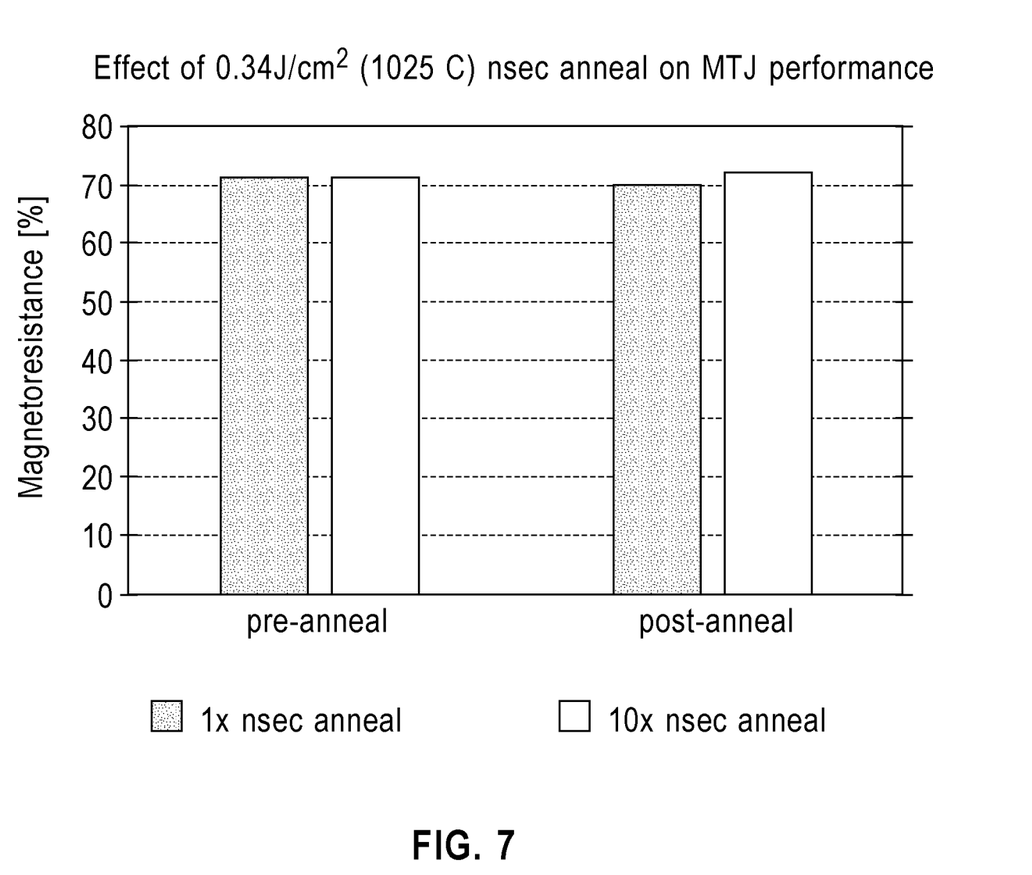
FIG. 7 is a graph that illustrates that the multiple laser anneals of the present application does not negatively impacting the multilayered MTJ pillar.

The multilayered MTJ pillar 30 can contain functional materials with a relatively low melting point of below about 1300° C. In this case, the desired anneal temperature range is from about 1000° C. to below the melting point of MTJ functional material. The melting point of MTJ functional material and a corresponding threshold in the incident laser energy density can be determined experimentally for a particular choice of the materials that provide the multilayered MTJ pillar 30 and laser annealing parameters by observing the multilayered MTJ pillar 30 electrical functionality before and after laser annealing; see, for example, FIG. 6 and FIG. 7 of the present application. Notably, FIG. 6 is a graph that illustrates that a laser anneal up to 1150° C. does not negatively impacting the multilayered MTJ pillar for an embodiment of the present application in which the multilayered MTJ pillar includes a CoFeB alloy MTJ functional material. Furthermore, FIG. 7 is a graph that illustrates that multiple laser anneals at 1025° C. (incident energy density of 0.34 J/cm$^2$) do not negatively impact the multilayered MTJ pillar for an embodiment of the present application in which the multilayered MTJ pillar includes a CoFeB alloy MTJ functional material.

In some embodiments, the low temperature deposited dielectric passivation layer 34 has a first hydrogen content and a first nitrogen-hydrogen bonding content and a first carbon-hydrogen bonding content, and the laser annealed dielectric passivation layer 36 has a second hydrogen content that is less than the first hydrogen content, and a second nitrogen-hydrogen bonding content that is less than the first nitrogen-hydrogen bonding content, and a second carbon-hydrogen bonding content that is less than the first carbon-hydrogen bonding content. The low temperature deposited dielectric passivation layer 34 has a first etch rate, and the laser annealed dielectric passivation layer 36 has a second etch rate that is lower than the first etch rate. In other embodiments, the low temperature deposited dielectric passivation layer 34 has a first Young's modulus, and the laser annealed dielectric passivation layer 36 has a second Young's modulus that is greater than the first Young's modulus. In some embodiments, the laser annealed dielectric passivation layer 36 has improved chemical bonding, i.e., less amount of bond terminating radicals such as hydrogen, hydro-carbon groups, and amino groups allowing for stronger framework of —Si—O—, —Si—N—, —C—N— and —B—N— bonding chains.

Without providing any limitation, the laser annealing of the dielectric passivation layer 34 at the temperature equal to or above about 1000° C. causes the bond terminating radicals such as hydrogen, hydro-carbon groups, or amino groups to detach freeing up neighboring dangling bonds to participate in chemically strong bonding chains. Detached radicals diffuse out of the film and desorb from free surfaces long after the laser-induced temperature pulse and some of them can re-attach themselves back to similar bond terminating sites partially negating positive effect of laser-induced dielectric film hardening. Thin dielectric films and the dielectric material near free surfaces for thick films have a higher likelihood of laser-induced hardening due to a shorter escape path for detached radicals. Annealing to a higher temperature but below the melting point of MTJ functional material increases the likelihood of detaching bond-terminating radicals and tying up neighboring dangling bonds. Longer annealing duration also increases the likelihood of detaching bond-terminating radicals and tying up neighboring dangling bonds. Advantageously, multiple short-duration laser anneals can be utilized in lieu of a longer annealing duration. Accordingly, 2 to 30 consecutive laser anneals can be utilized to increase a cumulative radiation exposure duration or, equivalently, a cumulative annealing duration by 2 to 30 fold over a single laser anneal. In one example shown in FIG. 7, the single radiation exposure duration at FWHM of 160 nanoseconds was extended to the cumulative radiation exposure duration of 1.6 microseconds by conducting 10 consecutive anneals. In other embodiments, the cumulative radiation exposure duration can be as high as 10 microseconds.

Figure 4:
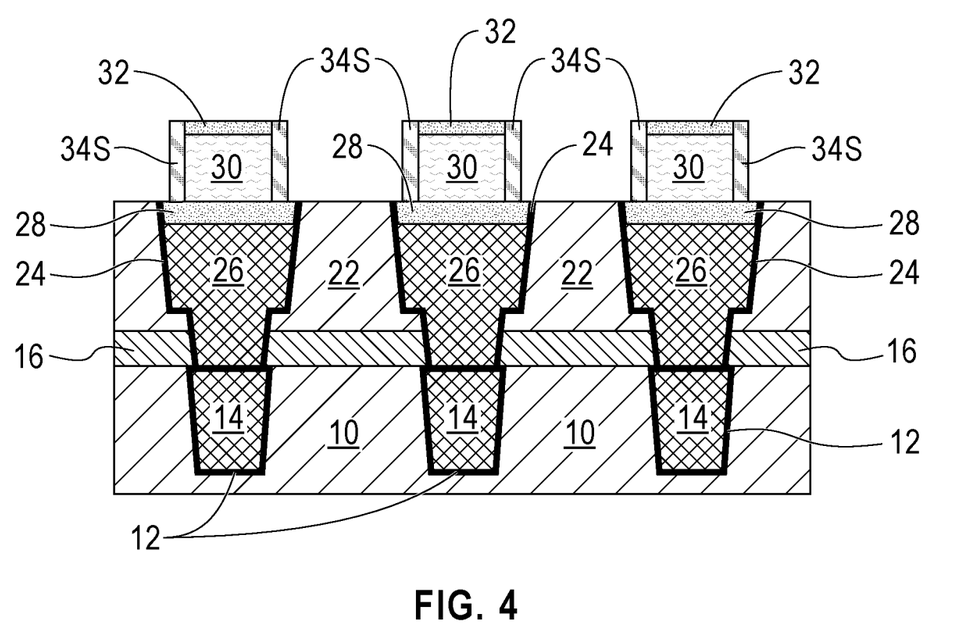
FIG. 4 is a cross sectional view of the exemplary structure of FIG. 2 after removing the dielectric passivation layer from all horizontal surfaces to provide a dielectric passivation spacer along the outermost sidewalls of the multilayered MTJ pillar and the top electrode.

Referring now FIG. 4, there is illustrated the exemplary structure of FIG. 2 after removing the dielectric passivation layer 34 from all horizontal surfaces to provide a dielectric passivation spacer 34S along the outermost sidewalls of the multilayered MTJ pillar 30 and the top electrode 32. In some embodiments, the dielectric passivation spacer 34S has a topmost surface that is coplanar with a topmost surface of the top electrode 32. In some embodiments, the dielectric passivation 34S has a bottommost surface that is located on a physically exposed surface of the conductive landing pad 28. The dielectric passivation spacer 34S can be formed by utilizing a spacer etch such as, for example, a reactive ion etch.

Figure 5:
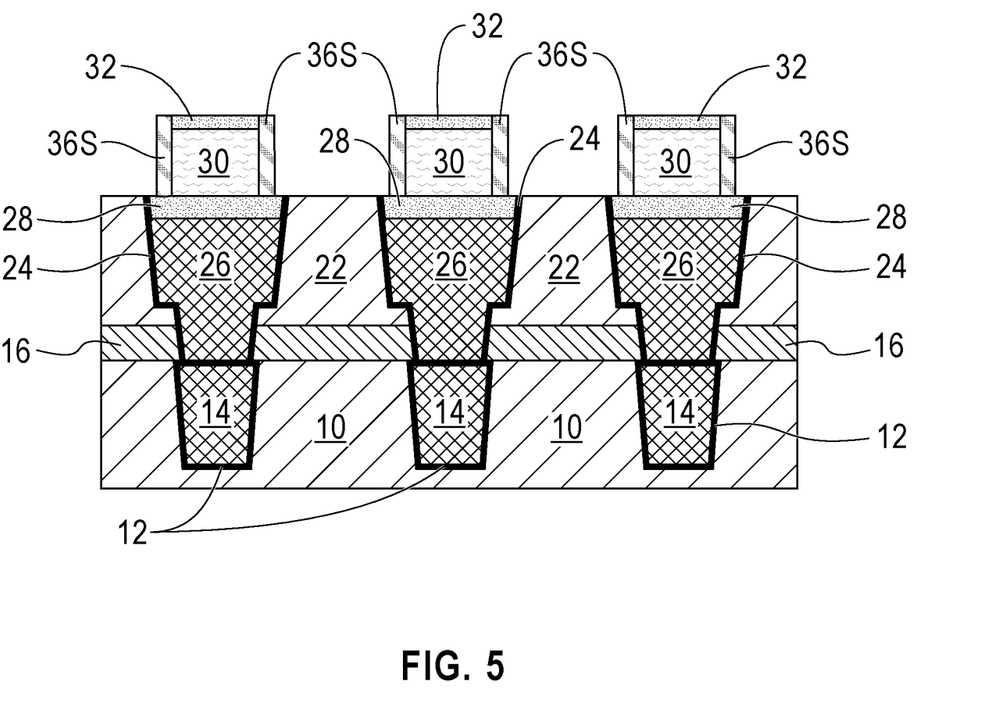
FIG. 5 is a cross sectional view of the exemplary structure of FIG. 4 after performing a laser anneal to improve the mechanical and chemical properties of the dielectric passivation spacer, without negatively impacting the multilayered MTJ pillar.

Referring now to FIG. 5, there is illustrated the exemplary structure of FIG. 4 after performing a laser anneal to improve the mechanical and chemical properties of the dielectric passivation spacer 34S, without negatively impacting the multilayered MTJ pillar 30. In the drawing, element 36S denotes the laser annealed dielectric passivation spacer 36S. The laser anneal used in this embodiment of the present application is the same as in the previous embodiment of the present application. The laser annealed dielectric passivation spacer 36 can have any of the improved mechanical and/or physical properties mentioned above in the previous embodiment of the present application.

Although not shown, the structure shown in either FIGS. 3 and 5 can be further processed to include an upper interconnect level that laterally surrounds, and is present atop, the multilayered MTJ pillar 30, the top electrode 32, and the laser annealed passivation material (26 or 26S). The upper interconnect level can include another electrically conductive structure embedded in another interconnect dielectric material. The another electrically conductive structure can contact a surface of the either the laser treated dielectric passivation layer 26 or the top electrode 32.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a magnetoresistive random access memory (MRAM) device, the method comprising:
    forming a structure including a multilayered magnetic tunnel junction (MTJ) pillar located on a surface of a conductive landing pad, and a top electrode located on the multilayered MTJ pillar;
    forming a dielectric passivation layer on physically exposed surfaces of the structure utilizing a deposition process that is performed at a temperature of 400° C. or less; and
    performing a laser anneal on the structure including the dielectric passivation layer to provide a laser annealed dielectric passivation layer, without negatively impacting the multilayered MTJ pillar.

2. The method of claim 1, furthering comprising performing an etch, prior to the performing of the laser anneal, to remove the dielectric passivation layer from horizontal surfaces of the structure, while maintaining the dielectric passivation layer on outermost sidewalls of the top electrode and the multilayered MTJ pillar.

3. The method of claim 1, wherein the dielectric passivation layer is composed of silicon nitride, or a dielectric material containing atoms of carbon and hydrogen.

4. The method of claim 1, wherein the temperature of the deposition process used in the forming of the dielectric passivation layer is from 200° C. to 400° C.

5. The method of claim 1, wherein the laser anneal comprises a single laser anneal or multiple laser anneals.

6. The method of claim 1, wherein the laser anneal is performed for a duration from about 1 nanosecond to about 500 nanoseconds.

7. The method of claim 1, wherein the dielectric passivation layer has a first hydrogen content and a first nitrogen content, and the laser annealed dielectric passivation layer has a second hydrogen content that is less than the first hydrogen content, and a second nitrogen content that is less than the first nitrogen content.

8. The method of claim 1, wherein the dielectric passivation layer has a first Young's modulus, and the laser annealed dielectric passivation layer has a second Young's modulus that is greater than the first Young's modulus.

9. The method of claim 1, wherein an entirety of the laser annealed dielectric passivation layer is modified by the laser anneal.

10. The method of claim 1, wherein only a surface portion of the laser annealed dielectric passivation layer is modified by the laser anneal.

* * * * *